(12) United States Patent
Gunnam

(10) Patent No.: US 8,499,226 B2
(45) Date of Patent: Jul. 30, 2013

(54) MULTI-MODE LAYERED DECODING

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 432 days.

(21) Appl. No.: 12/826,026

(22) Filed: Jun. 29, 2010

(65) Prior Publication Data
US 2011/0320902 A1    Dec. 29, 2011

(51) Int. Cl.
*H03M 13/03* (2006.01)
*H03M 13/00* (2006.01)

(52) U.S. Cl.
USPC ........... 714/786; 714/755; 714/780; 714/800; 714/807

(58) Field of Classification Search
USPC ............................ 714/786, 755, 800, 807, 780
See application file for complete search history.

(56) References Cited

U.S. PATENT DOCUMENTS

| | | | |
|---|---|---|---|
| 3,755,779 A | 8/1973 | Price | |
| 4,295,218 A | 10/1981 | Tanner | |
| 5,048,060 A | 9/1991 | Arai et al. | |
| 5,721,745 A * | 2/1998 | Hladik et al. | 714/755 |
| 5,734,962 A * | 3/1998 | Hladik et al. | 455/12.1 |
| 6,023,783 A * | 2/2000 | Divsalar et al. | 714/792 |
| 6,236,686 B1 | 5/2001 | Kamishima | |
| 6,307,901 B1 | 10/2001 | Yu et al. | |
| 6,550,023 B1 | 4/2003 | Brauch et al. | |
| 6,662,331 B1 * | 12/2003 | Kang | 714/755 |
| 6,678,843 B2 * | 1/2004 | Giulietti et al. | 714/701 |
| 6,745,157 B1 | 6/2004 | Weiss et al. | |
| 6,760,879 B2 * | 7/2004 | Giese et al. | 714/755 |
| 6,888,897 B1 | 5/2005 | Nazari et al. | |
| 6,910,000 B1 | 6/2005 | Yedidia et al. | |
| 7,143,333 B2 | 11/2006 | Blankenship et al. | |
| 7,181,676 B2 * | 2/2007 | Hocevar | 714/780 |

(Continued)

FOREIGN PATENT DOCUMENTS

| | | | |
|---|---|---|---|
| JP | 2001251384 A | 9/2001 | |
| JP | 2005020505 A | 1/2005 | |

(Continued)

OTHER PUBLICATIONS

K. Gunnam et al., "Value-Reuse Properties of Min-Sum for GF(q)" (dated Oct. 2006) Dept. of ECE, Texas A&M University Technical Note, published about Aug. 2010.

(Continued)

*Primary Examiner* — John J Tabone, Jr.
(74) *Attorney, Agent, or Firm* — Mendelsohn, Drucker & Associates, P.C.; Craig M. Brown; Steve Mendelsohn

(57) ABSTRACT

In one embodiment, a turbo equalizer is selectively operable in either first or second modes. In the first mode, layered (low-density parity-check (LDPC)) decoding is performed on soft-output values generated by a channel detector, where, for each full local decoder iteration, the updates of one or more layers of the corresponding H-matrix are skipped. If decoding fails to converge on a valid LDPC-encoded codeword and a specified condition is met, then LDPC decoding is performed in a second mode, where the updates of all of the layers of the H-matrix are performed for each full local decoder iteration, including the one or more layers that were previously skipped in the first mode. Skipping one or more layers in the first mode increases throughput of the decoder, while updating all layers in the second mode increases error correction capabilities of the decoder.

23 Claims, 3 Drawing Sheets

U.S. PATENT DOCUMENTS

| | | | |
|---|---|---|---|
| 7,219,288 | B2 | 5/2007 | Dielissen et al. |
| 7,237,181 | B2 | 6/2007 | Richardson |
| 7,296,216 | B2 | 11/2007 | Shen et al. |
| 7,340,671 | B2 | 3/2008 | Jones et al. |
| 7,353,444 | B2 | 4/2008 | Owsley et al. |
| 7,457,367 | B2 | 11/2008 | Farhang-Boroujeny et al. |
| 7,689,888 | B2 | 3/2010 | Kan et al. |
| 7,725,800 | B2 | 5/2010 | Yang et al. |
| 7,730,377 | B2 * | 6/2010 | Hocevar ............... 714/752 |
| 7,739,558 | B1 | 6/2010 | Farjadrad et al. |
| 7,752,523 | B1 | 7/2010 | Chaichanavong et al. |
| 7,770,090 | B1 | 8/2010 | Kons et al. |
| 7,805,642 | B1 | 9/2010 | Farjadrad |
| 7,895,500 | B2 | 2/2011 | Sun et al. |
| 7,904,793 | B2 | 3/2011 | Mokhlesi et al. |
| 7,941,737 | B2 | 5/2011 | Gopalakrishnan et al. |
| 7,949,927 | B2 | 5/2011 | Park et al. |
| 8,010,869 | B2 | 8/2011 | Wehn et al. |
| 8,020,070 | B2 | 9/2011 | Langner et al. |
| 8,037,394 | B2 | 10/2011 | Djurdjevic et al. |
| 8,046,658 | B2 | 10/2011 | Heinrich et al. |
| 8,051,363 | B1 | 11/2011 | Liu |
| 8,103,931 | B2 | 1/2012 | Wang et al. |
| 8,127,209 | B1 | 2/2012 | Zhang et al. |
| 8,151,171 | B2 | 4/2012 | Blanksby |
| 8,156,409 | B2 | 4/2012 | Patapoutian et al. |
| 8,161,345 | B2 | 4/2012 | Graef |
| 8,171,367 | B2 | 5/2012 | Gao et al. |
| 8,205,134 | B2 | 6/2012 | Harrison et al. |
| 8,205,144 | B1 | 6/2012 | Yadav |
| 8,214,719 | B1 | 7/2012 | Sheng et al. |
| 8,219,878 | B1 | 7/2012 | Varnica et al. |
| 8,255,763 | B1 | 8/2012 | Yang et al. |
| 8,301,984 | B1 | 10/2012 | Zhang et al. |
| 8,312,354 | B1 * | 11/2012 | Varnica et al. ............ 714/780 |
| 2002/0062468 | A1 | 5/2002 | Nagase et al. |
| 2002/0166095 | A1 | 11/2002 | Lavi et al. |
| 2005/0132260 | A1 | 6/2005 | Kyung et al. |
| 2005/0193320 | A1 | 9/2005 | Varnica et al. |
| 2005/0204255 | A1 | 9/2005 | Yeh et al. |
| 2005/0283707 | A1 | 12/2005 | Sharon et al. |
| 2006/0013306 | A1 * | 1/2006 | Kim et al. ............ 375/240.12 |
| 2006/0036928 | A1 | 2/2006 | Eroz et al. |
| 2006/0107181 | A1 | 5/2006 | Dave et al. |
| 2006/0115802 | A1 | 6/2006 | Reynolds |
| 2006/0285852 | A1 | 12/2006 | Xi et al. |
| 2007/0011569 | A1 | 1/2007 | Vila Casado et al. |
| 2007/0011573 | A1 | 1/2007 | Farjadrad et al. |
| 2007/0011586 | A1 | 1/2007 | Belogolovyi et al. |
| 2007/0044006 | A1 | 2/2007 | Yang et al. |
| 2007/0071009 | A1 | 3/2007 | Nagaraj et al. |
| 2007/0089018 | A1 | 4/2007 | Tang et al. |
| 2007/0089019 | A1 | 4/2007 | Tang et al. |
| 2007/0124652 | A1 | 5/2007 | Litsyn et al. |
| 2007/0147481 | A1 | 6/2007 | Bottomley et al. |
| 2007/0153943 | A1 | 7/2007 | Nissila |
| 2007/0162788 | A1 | 7/2007 | Moelker |
| 2007/0220408 | A1 | 9/2007 | Huggett et al. |
| 2007/0234178 | A1 | 10/2007 | Richardson et al. |
| 2007/0234184 | A1 | 10/2007 | Richardson |
| 2008/0049869 | A1 | 2/2008 | Heinrich et al. |
| 2008/0082868 | A1 | 4/2008 | Tran et al. |
| 2008/0104485 | A1 | 5/2008 | Lyakh et al. |
| 2008/0109701 | A1 | 5/2008 | Yu et al. |
| 2008/0126910 | A1 | 5/2008 | Venkatesan et al. |
| 2008/0148129 | A1 | 6/2008 | Moon |
| 2008/0163032 | A1 | 7/2008 | Lastra-Montano |
| 2008/0235561 | A1 * | 9/2008 | Yang ............... 714/801 |
| 2008/0276156 | A1 | 11/2008 | Gunnam et al. |
| 2008/0301517 | A1 | 12/2008 | Zhong |
| 2008/0301521 | A1 | 12/2008 | Gunnam et al. |
| 2009/0063931 | A1 | 3/2009 | Rovini et al. |
| 2009/0083609 | A1 | 3/2009 | Yue et al. |
| 2009/0132897 | A1 | 5/2009 | Xu et al. |
| 2009/0150745 | A1 | 6/2009 | Langner et al. |
| 2009/0235146 | A1 | 9/2009 | Tan et al. |
| 2009/0259912 | A1 | 10/2009 | Djordjevic et al. |
| 2009/0273492 | A1 | 11/2009 | Yang et al. |
| 2009/0307566 | A1 | 12/2009 | No et al. |
| 2009/0319860 | A1 | 12/2009 | Sharon et al. |
| 2010/0037121 | A1 | 2/2010 | Jin et al. |
| 2010/0042806 | A1 | 2/2010 | Gunnam |
| 2010/0042890 | A1 | 2/2010 | Gunnam |
| 2010/0050043 | A1 | 2/2010 | Savin |
| 2010/0058152 | A1 | 3/2010 | Harada |
| 2010/0088575 | A1 | 4/2010 | Sharon et al. |
| 2011/0041029 | A1 | 2/2011 | Yedidia et al. |
| 2012/0135285 | A1 | 5/2012 | Iwama et al. |
| 2012/0139074 | A1 | 6/2012 | Abe |

FOREIGN PATENT DOCUMENTS

| | | |
|---|---|---|
| JP | 2007306495 A | 11/2007 |
| JP | 2009100222 A | 5/2009 |
| WO | WO03092170 A1 | 11/2003 |
| WO | WO2004079563 A1 | 9/2004 |
| WO | WO2007114724 A1 | 10/2007 |
| WO | WO2008004215 A2 | 1/2008 |
| WO | WO 2010/019168 A1 | 2/2010 |

OTHER PUBLICATIONS

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block-LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, pp. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, in Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963, pp. 90.

T. Richardson and R. Urbanke—"Modern Coding Theory", Cambridge University Press, Preliminary version—Oct. 18, 2007, pp. 590.

Kiran Gunnam, Gwan Choi, Weihuang Wang, Mark Yeary—"Multi-Rate Layered Decoder Architecture for.Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation.Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981,pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Richardson, Tom, "Error Floors of LDPC Codes," Allerton Conf. on Communication, Control and Computing, (Monticello, Illinois), Oct. 2003, pp. 1426-1435.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Sripimanwat, K., "Turbo Code Applications: A Journey From a Paper to Realization", Oct. 26, 2005, Springer, p. 27.

Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, Vol., No., pp. 561-565, Jun. 28, 2009-Jul. 3, 2009.

Laendner, S.; Milenkovic, O.; , "LDPC Codes Based on Latin Squares: Cycle Structure, Stopping Set, and Trapping Set Analysis," Communications, IEEE Transactions on, vol. 55, No. 2, pp. 303-312, Feb. 2007.

Dehkordi, M.K,; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.

C. A. Cole, S. G. Wilson, E. K. Hall and T. R. Giallorenzi, "A General Method for Finding Low Error Rates of LDPC Codes," http://arxiv.org/abs/cs.IT/0605051.

D. MacKay and M. Postol, "Weaknesses of margulis and ramanujan-margulis low-density parity-check codes," Electronic Notes in Theoretical Computer Science, vol. 74, 2003.

B. Xia and W. E. Ryan, "On importance sampling for linear block codes," Proc. 2003 IEEE International Conference on Communications, vol. 4, pp. 2904-2908, May 2003.

L. Dolecek, Z. Zhang, M. Wainwright, V. Anantharam, and B. Nikoli'c, "Evaluation of the low frame error rate performance of LDPC codes using importance sampling," 2007 IEEE Inform. Theory Workshop, Sep. 2-6, 2007.

Casado, V., et al., "Informed Dynamic Scheduling for Belief-Propagation Decoding of LDPC Codes," IEEE International Conference on Communications, Jun. 24-28, 2007, pp. 932-937.

Presman, N., et al., "Efficient Layers-based Schedules for Iterative Decoding of LDPC Codes," IEEE International Symposium on Information Theory, Jul. 6-11, 2008, pp. 1148-1152.

Radosavljevic, P., et al., "Optimized Message Passing Schedules for LDPC Decoding," Conference Record of the Thirty-Ninth Asilomar conference on Signals, Systems and Computers, Oct. 28, 2005-Nov. 1, 2005, pp. 591-595.

Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.

Sakai, R., et al., "Reduced Complexity Decoding Based on Approximation of Update Function for Low-Density Parity-Check Codes," Transactions of the Institute of Electronics, Information and Communication Engineers, Feb. 1, 2007, vol. J90-A, No. 2, pp. 83-91.

Koetter, R., et al. "Turbo equalization," Signal Processing Magazine, IEEE, vol. 21, No. 1, pp. 67-80, Jan. 2004.

Ryan, W. E., et al., "Channel Codes: Classical and Modern," Cambridge University Press, 2009, 710 pages.

* cited by examiner $$H = \begin{Bmatrix} P_{1,1} & 0 & P_{1,3} & P_{1,4} & 0 & \cdots & 0 & P_{1,10} \\ P_{2,1} & P_{2,2} & 0 & P_{2,4} & P_{2,5} & \cdots & 0 & \cdot \\ \cdot & \cdot & \cdot & \cdot & \cdot & \cdots & \cdot & \cdot \\ \cdot & \cdot & \cdot & \cdot & \cdot & \cdots & \cdot & \cdot \\ \cdot & \cdot & \cdot & \cdot & \cdot & \cdots & \cdot & \cdot \\ P_{11,1} & P_{11,2} & 0 & P_{11,4} & 0 & \cdots & 0 & 0 \\ 1 & 1 & 1 & 1 & 1 & \cdots & 1 & 1 \end{Bmatrix}$$

MULTI-MODE LAYERED DECODING

CROSS-REFERENCE TO RELATED APPLICATIONS

The subject matter of this application is related to:
U.S. patent application Ser. No. 12/113,729 filed May 1, 2008,
U.S. patent application Ser. No. 12/113,755 filed May 1, 2008,
U.S. patent application Ser. No. 12/323,626 filed Nov. 26, 2008,
U.S. patent application Ser. No. 12/401,116 filed Mar. 10, 2009,
U.S. patent application Ser. No. 12/675,981 filed on Mar. 2, 2010,
U.S. patent application Ser. No. 12/677,322 filed Mar. 10, 2010,
U.S. patent application Ser. No. 12/680,810 filed Mar. 30, 2010,
U.S. application Ser. No. 12/524,418 filed on Jul. 24, 2009,
U.S. patent application Ser. No. 12/420,535 filed Apr. 8, 2009,
U.S. patent application Ser. No. 12/475,786 filed Jun. 1, 2009,
U.S. patent application Ser. No. 12/260,608 filed on Oct. 29, 2008,
PCT patent application no. PCT/US09/41215 filed on Apr. 21, 2009,
U.S. patent application Ser. No. 12/427,786 filed on Apr. 22, 2009,
U.S. patent application Ser. No. 12/492,328 filed on Jun. 26, 2009,
U.S. patent application Ser. No. 12/492,346 filed on Jun. 26, 2009,
U.S. patent application Ser. No. 12/492,357 filed on Jun. 26, 2009,
U.S. patent application Ser. No. 12/492,374 filed on Jun. 26, 2009,
U.S. patent application Ser. No. 12/538,915 filed on Aug. 11, 2009,
U.S. patent application Ser. No. 12/540,078 filed on Aug. 12, 2009,
U.S. patent application Ser. No. 12/540,035 filed on Aug. 12, 2009,
U.S. patent application Ser. No. 12/540,002 filed on Aug. 12, 2009,
U.S. patent application Ser. No. 12/510,639 filed on Jul. 28, 2009,
U.S. patent application Ser. No. 12/524,418 filed on Jul. 24, 2009,
U.S. patent application Ser. No. 12/510,722 filed on Jul. 28, 2009,
U.S. patent application Ser. No. 12/510,667 filed on Jul. 28, 2009,
U.S. patent application Ser. No. 12/644,622 filed on Dec. 22, 2009,
U.S. patent application Ser. No. 12/644,181 filed on Dec. 22, 2009, and
U.S. patent application Ser. No. 12/766,038 filed on Apr. 23, 2010,
the teachings of all of which are incorporated herein by reference in their entirety.

BACKGROUND OF THE INVENTION

1. Field of the Invention

The present invention relates to signal processing, and, more specifically but not exclusively, to error-correction encoding and decoding techniques such as low-density parity-check (LDPC) encoding and decoding.

2. Description of the Related Art

In attempting to recover a correct low-density parity-check (LDPC)-encoded codeword, an LDPC decoder may encounter one or more trapping sets that prevent the decoder from properly decoding the codeword. Trapping sets, which represent subgraphs in a Tanner graph of an LDPC code, typically have a strong influence on error-floor characteristics of the LDPC code because a trapping set may force the decoder to converge to an incorrect result. To improve error-floor characteristics, an LDPC decoder may employ different techniques to, for example, (i) break the trapping sets and/or (ii) prevent the LDPC decoder from converging on trapping sets.

SUMMARY OF THE INVENTION

In one embodiment, the present invention is a receiver-implemented method for recovering an error correction (EC)-encoded codeword that is encoded based on a parity-check matrix having plurality of layers. The method comprises performing layered EC decoding on a first set of input values in a first mode. For each full local iteration of EC decoding performed in the first mode, updates corresponding to a first set of layers of the parity-check matrix are performed. Further, the method comprises performing layered EC decoding on a second set of input values in a second mode. For each full local iteration of EC decoding in the second mode, updates corresponding to a second set of the layers of the parity-check matrix are performed, wherein the second set of layers is different from the first set of layers.

In another embodiment, the present invention is an apparatus that recovers an error correction (EC)-encoded codeword that is encoded based on a parity-check matrix having plurality of layers. The apparatus comprises an EC decoder and a controller. The EC decoder is adapted to perform layered EC decoding on a first set of input values in a first mode. For each full local iteration of EC decoding performed in the first mode, updates corresponding to a first set of layers of the parity-check matrix are performed. The EC decoder is also adapted to perform layered EC decoding on a second set of input values in a second mode. For each full local iteration of EC decoding in the second mode, updates corresponding to a second set of layers of the parity-check matrix are performed, wherein the second set of layers is different from the first set of layers. The controller is adapted to determine whether the EC decoder operates in the first mode or the second mode.

In yet another embodiment, the present invention is an apparatus that recovers an error correction (EC)-encoded codeword that is encoded based on a parity-check matrix having plurality of layers. The apparatus comprises means for performing layered EC decoding on a first set of input values in a first mode. For each full local iteration of EC decoding performed in the first mode, updates corresponding to a first set of layers of the parity-check matrix are performed. The apparatus further comprises means for performing layered EC decoding on a second set of input values in a second mode. For each full local iteration of EC decoding in the second mode, updates corresponding to a second set of layers of the parity-check matrix are performed, wherein the second set of layers is different from the first set of layers. The apparatus yet further comprises means for determining whether the EC decoder operates in the first mode or the second mode.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 2 shows an H-matrix according to one embodiment of the present invention.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

According to various embodiments of the present invention, layered low-density parity-check (LDPC) decoding is performed in a first mode, wherein the check node and variable node updates of one or more layers of the corresponding parity-check matrix (a.k.a., H-matrix) are skipped. By skipping the check node and variable node updates of one or more layers of the H-matrix, throughput of the LDPC decoder may be increased. If the LDPC decoder fails to converge on a valid LDPC-encoded codeword and a specified condition (discussed below) is met, then LDPC decoding may be performed for the LDPC-encoded codeword in a second mode by performing the check node and variable node updates of all of the layers of the H-matrix, including the one or more layers of the H-matrix that were skipped in the first mode.

Figure 1:
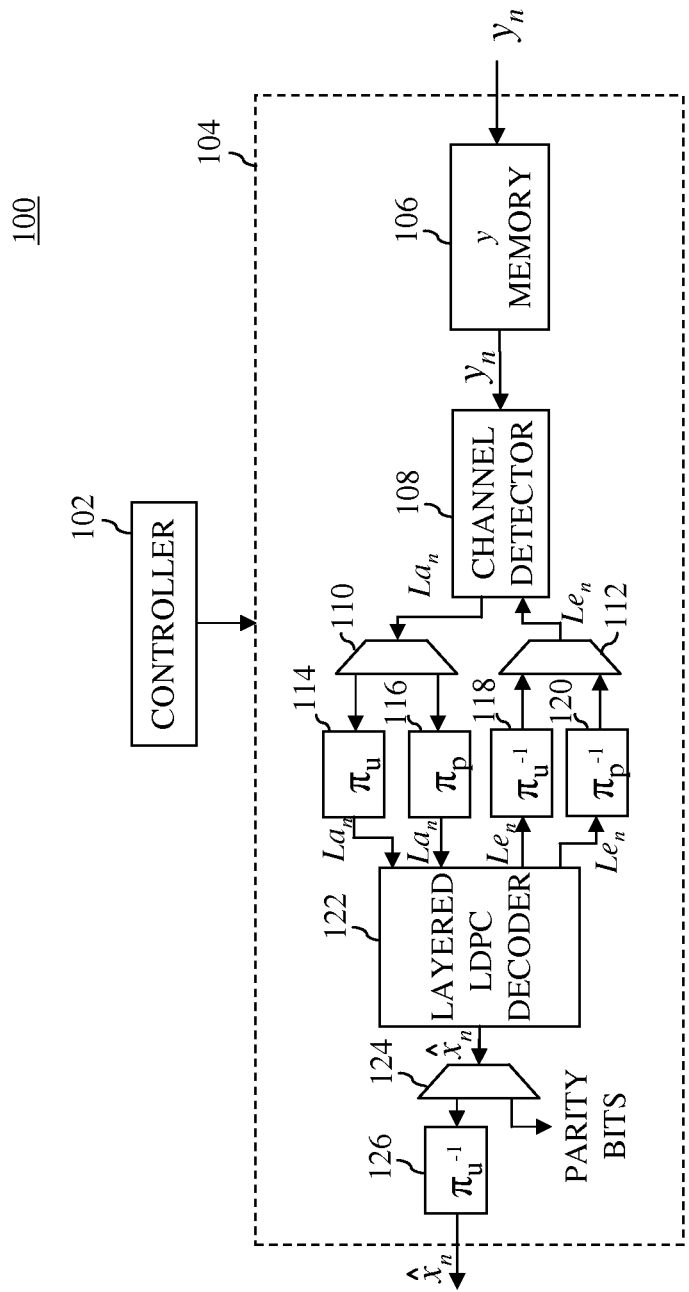
FIG. 1 shows a simplified block diagram of a portion of a signal processing receiver according to one embodiment of the present invention.

FIG. 1 shows a simplified block diagram of a portion of a signal processing receiver 100 according to one embodiment of the present invention. Signal processing receiver 100, which has turbo equalizer 104 and controller 102, may be implemented in a hard-disk drive (HDD) or any other suitable signal processing device. Turbo equalizer 104 receives samples $y_n$ from upstream processing, where each sample corresponds to a bit of an LDPC-encoded codeword. The upstream processing may perform, for example, amplification, analog-to-digital conversion, finite-impulse-response (FIR) filtering, equalization, and possibly other processing suitable for retrieving data from an HDD platter or receiving a transmitted signal. To further understand the operation of turbo equalizer 104, consider FIG. 3.

Figure 3:
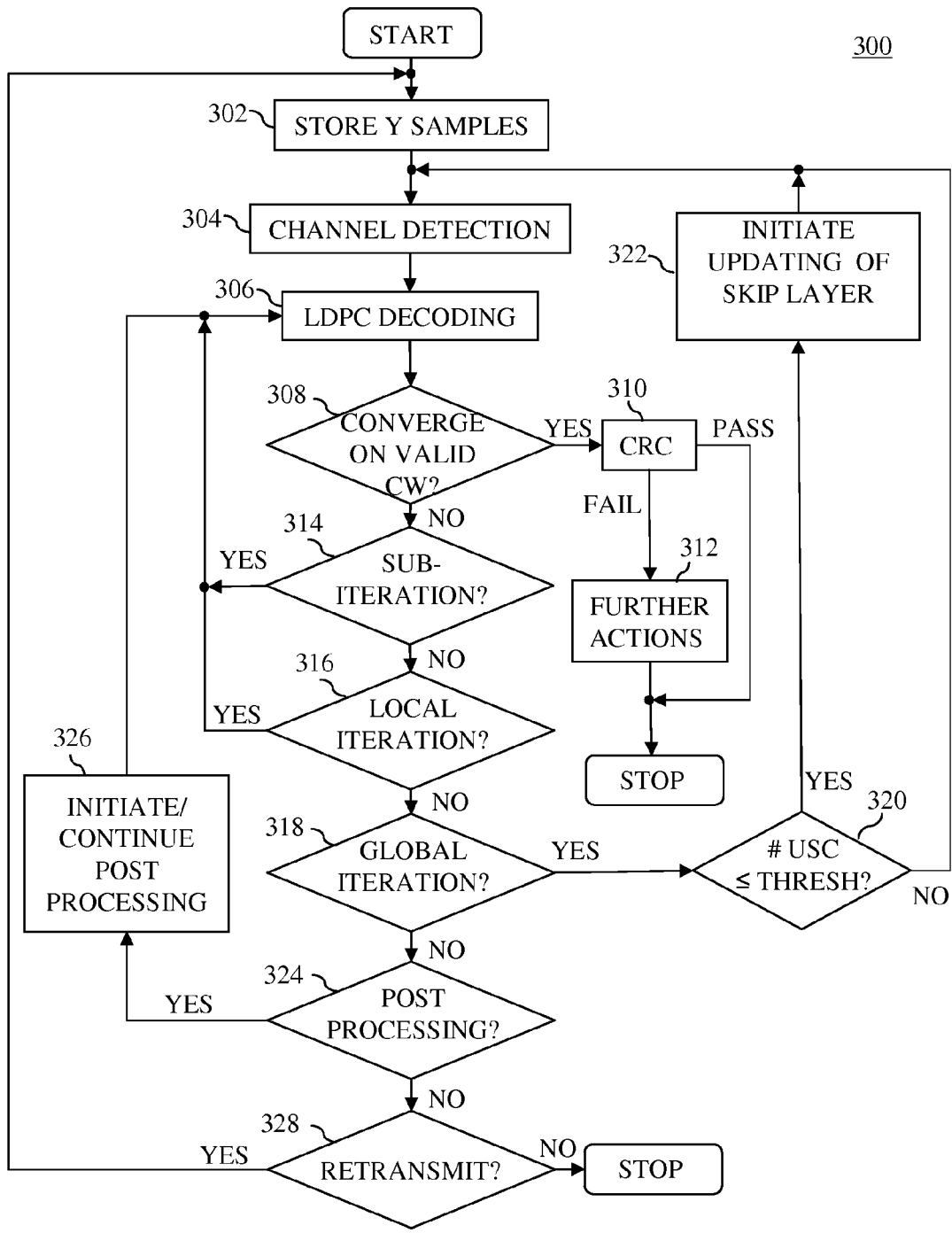
FIG. 3 shows a simplified flow diagram of processing according to one embodiment of the present invention that may be implemented by the signal processing receiver of FIG. 1.

FIG. 3 shows a simplified flow diagram 300 of processing according to one embodiment of the present invention that may be implemented by signal processing receiver 100 of FIG. 1. Initially, as controlled by controller 102, turbo equalizer 104 is operated in the first mode, wherein LDPC decoder 122 skips the updating for one or more layers of the H-matrix during each local iteration as discussed below. For each LDPC-encoded codeword processed, the corresponding $y_n$ samples are provided to $y$ memory 106, which stores the $y_n$ samples (action 302) and provides the $y_n$ samples to channel detector 108.

Channel detector 108 implements a suitable detection technique (action 304), such as Viterbi soft-output detection or maximum a posteriori (MAP) detection, to generate an initial soft-output value $La_n^{(0)}$ (e.g., a log-likelihood ratio (LLR)) corresponding to each bit n of the LDPC-encoded codeword. Note that, as used in this specification, the term "soft-output value" refers to a value comprising a hard-decision bit (i.e., the most-significant bit) and at least one confidence value bit (i.e., the least-significant bits). Depending on the implementation, soft-output values can be implemented in, for example, sign-magnitude format, two's-complement format, or any other suitable format.

To reduce the effects that burst errors in a transmission channel have on recovering data at a receiver, many data transmission systems employ data interleaving schemes. In one possible implementation of a system employing both LDPC encoding and interleaving, at the transmitter, un-interleaved data is encoded, and the resulting encoded codeword is interleaved for transmission. At the receiver, the received encoded codeword is de-interleaved and then decoded to recover the original data stream. In this implementation, the data is encoded in an un-interleaved domain and the codeword is transmitted in an interleaved domain.

In another possible implementation, the data is encoded in an interleaved domain and transmitted in an un-interleaved domain. In this implementation, at the transmitter, the data is first interleaved, and the resulting interleaved data is encoded to generate an encoded codeword. The encoded codeword is then de-interleaved for transmission. Note that the de-interleaved domain is identical to the original un-interleaved domain. At the receiver, in order to be able to decode the encoded codeword in the interleaved domain, the received encoded codeword is interleaved prior to decoding. After decoding, the resulting decoded data is then de-interleaved to output the recovered data in the original un-interleaved domain. Turbo equalizer 104 shows an example of this interleaving scheme.

At receiver 100, channel detector 108 provides the initial soft-output values $La_n^{(0)}$ to de-multiplexer 110, which de-multiplexes the soft-output values $La_n^{(0)}$ corresponding to user-data bits, herein referred to as user-data soft-output values $La_n^{(0)}$, from the soft-output values $La_n^{(0)}$ corresponding to parity bits, herein referred to as parity soft-output values $La_n^{(0)}$. The user-data soft-output values $La_n^{(0)}$ are provided to interleaver 114, which performs interleaving on the user-data soft-output values $La_n^{(0}$ using an interleaving mapping $\pi_u$. Similarly, the parity soft-output values $La_n^{(0)}$ are provided to interleaver 116, which performs interleaving using an interleaving mapping $\pi_p$. Interleaving mappings $\pi_u$ and $\pi_p$ correspond to interleaving mappings used by the LDPC encoder (not shown). Note that to simplify FIG. 3, the interleaving, de-interleaving, multiplexing, and de-multiplexing steps are not explicitly shown.

Interleavers 114 and 116 output their respective interleaved soft-output values $La_n^{(0)}$ to layered LDPC decoder 122, which performs layered LDPC decoding (action 306) to recover the original LDPC-encoded codeword. An example of a layered-LDPC decoder may be found in, for example, U.S. patent application Ser. No. 12/475,786. In performing layered decoding, LDPC decoder 122 skips the updating of at least one layer of the H-matrix, herein referred to as the skipped layer(s). As discussed below in relation to decision 320 and action 322, LDPC decoder 122 may operate in a second mode where LDPC decoder 122 performs the updating of all of the layers of the H-matrix, including the at least one skipped layer, during future processing if LDPC decoder 122 fails to recover a valid LDPC-encoded codeword. To further understand layered LDPC decoding, consider FIG. 2.

FIG. 2 shows an H-matrix 200 according to one embodiment of the present invention. H-matrix 200 comprises 120 sub-matrices that are arranged in r=12 block rows of sub-matrices and c=10 block columns of sub-matrices. Each matrix entry $P_{j,k}$ represents a p×p sub-matrix, where j=1, . . . , r and k=1, . . . , c. Each matrix entry $P_{j,k}$ is either (i) an identity matrix, (ii) a circulant, which is obtained by cyclically shifting an identity matrix, or (iii) an identity matrix that is permuted using a method other than cyclic shifting (e.g., more random than cyclic shifting). Each matrix entry "0" represents a p×p zero matrix, and each matrix entry "I" represents a p×p identity matrix. For purposes of this discussion, assume that p=96 such that H-matrix 200 has p×r=96×12=1, 152 total individual rows and p×c=96×10=960 total individual columns. Each of the 1,152 individual rows of H-matrix 200 corresponds to an check node, where m ranges from 1, . . . , 1,152, and each of the 960 individual columns corresponds to an $n^{th}$ variable node (also referred to as a bit node), where n ranges from 1, . . . , 960.

In this embodiment, each block row represents a layer of H-matrix 200. In other embodiments, each layer may correspond to more than one block row. The last block row (i.e., the twelfth block row) represents the layer that is skipped during LDPC decoding, herein referred to as the "skipped layer." Each sub-matrix in the twelfth block row is an identity matrix, and the row hamming weight (i.e., the number of entries having a value of one) of each individual row of each identity matrix is equal to one. Thus, the total hamming weight for each row of the twelfth block row is equal to 1×c=1×10=10. Note that the hamming weight for a row may be referred to as the check-node degree, which is defined as the number of non-zero elements in a row. All other block rows (i.e., the first to eleventh block rows) comprise one or more sub-matrices $P_{j,k}$ and one or more "0" sub-matrices. Since each sub-matrix $P_{j,k}$ is a permutation of an identity matrix, the hamming weight of each row in a sub-matrix $P_{j,k}$ is equal to one. Further, since each "0" matrix has no entries equal to one, the hamming weight of each individual row in a "0" sub-matrix is equal to zero. Considering that each of the first to eleventh block rows have one or more "0" sub-matrices, the total hamming weight for each individual row in the first to eleventh block rows is less than that of each individual row in the twelfth block row (i.e., the row hamming weight of each individual row in the first to eleventh block rows is less than 10). Thus, each individual row of the twelfth block row has a higher hamming weight than each individual row of the first to eleventh block rows. Note that other H-matrix configurations are possible within the scope of the present invention. These other possible configurations are discussed further below.

Initially, upon receiving the interleaved soft-output values $La_n^{(0)}$, LDPC decoder 122 performs a sub-iteration to perform the variable node updates (i.e., updates corresponding to the columns) and check node updates (i.e., updates corresponding to the rows) in the first layer (i.e., the first block row) of H-matrix 200. A sub-iteration corresponds to the updating of all check nodes and all variable nodes of one layer of H-matrix 200, and does not involve channel detection or interleaving/de-interleaving. A local iteration corresponds to the updating of all check nodes and all variable nodes of all layers in H-matrix 200 that are processed by LDPC decoder 122 in the present mode, and does not involve channel detection or interleaving/de-interleaving. In this particular embodiment, a local iteration of the first mode is completed when all of the check node and variable node updates of the first to eleventh layers are performed (i.e., when eleven sub-iterations are performed). A local iteration of the second mode (which is discussed below) is completed when all of the check node and variable node updates of all twelve layers are performed (i.e., when twelve sub-iterations are performed). Since an iteration of the first mode performs fewer sub-iterations than an iteration of the second mode, an iteration of the first mode may be performed in less time than an iteration of the second mode.

During each sub-iteration of LDPC decoder 122, LDPC decoder 122 generates a set of updated soft-output values $P_n$, where each value $P_n$ corresponds to the $n^{th}$ bit of the 960-bit LDPC-encoded codeword and each value $P_n$ comprises a hard-decision bit $\hat{x}_n$ and a confidence value. Each column n of H-matrix 200 of FIG. 2 corresponds to bit n of the 960-bit codeword, where n=1, . . . , 960. When a set of hard-decision bits $\hat{x}_n$ have been generated for the subject codeword, turbo equalizer 104 performs decision 308 to determine whether or not LDPC decoder 122 has converged on a valid codeword. In particular, turbo equalizer 104 performs a parity check by multiplying a vector $\hat{x}$, formed from the set of hard-decision bits $\hat{x}_n$, and the transpose $H^T$ of the LDPC parity-check matrix (i.e., H-matrix) used to generate the LDPC-encoded codeword (assuming binary summation). Binary summation, which is addition in GF(2), where GF stands for Galois field, is used because H-matrix 200 is in binary form. If H-matrix 200 were in GF(4), then vector-matrix multiplication would be performed in GF(4). The resulting product is a vector, often referred to as the syndrome, and each bit of the syndrome corresponds to one individual row (i.e., check node) of the LDPC parity-check matrix. Note that, although the updating of the twelfth layer is not performed in the first mode, the parity check is performed for the entire LDPC parity-check matrix.

If each element of the resulting syndrome is equal to zero (i.e., $\hat{x}H^T=0$), then LDPC decoder 122 has converged on a valid codeword. In this case, the hard-decision bits $x_n$ corresponding to user data, herein referred to as user-data hard-decision bits $x_n$, are de-multiplexed from the hard-decision bits $x_n$ corresponding to parity bits, herein referred to as parity hard-decision bits $x_n$, using de-multiplexer 124. The parity hard-decision bits $x_n$ may be used for debugging or other purposes, but are not provided downstream along with the user-data hard-decision bits $x_n$. The user-data hard-decision bits $x_n$ are de-interleaved by de-interleaver 126, which uses a de-interleaving mapping $\pi_u^{-1}$ that is the inverse of the interleaving mapping $\pi_u$ used by interleaver 114. Therefore, the sequence of user-data hard-decision bits $x_n$ output from de-interleaver 126 corresponds to the sequence of initial soft-output values $La_n^{(0)}$ input to interleaver 114.

The de-interleaved user-data hard-decision data bits $x_n$ are provided to downstream processing (not shown in FIG. 1), which may perform, for example, a cyclic-redundancy check (CRC) (action 310) to determine whether the valid codeword is the correct codeword (i.e., the codeword that was written to the HDD platter or transmitted). When CRC check is part of the encoding scheme, typically a number of CRC check bits are appended to the user data at the transmitter before LDPC encoding such that, upon decoding, the vector $\hat{x}$ output from de-interleaver 126 comprises (i) the user data transmitted by the transmitter and (ii) the CRC check bits. To perform the CRC check, the user data may be divided by a keyword that is known a priori by the receiver, and the remainder of the division process may be compared to the CRC check bits. If the remainder is equal to the CRC check bits, then the CRC check has passed, indicating that LDPC decoder 122 has converged on the correct codeword, and decoding for the subject codeword is then stopped. If the remainder is not equal to the r CRC check bits, then the CRC check has failed, indicating that LDPC decoder 122 has converged on a valid codeword that is not the correct codeword (i.e., the valid codeword has one or more missatisfied check nodes). In this case, further actions 312 may be taken to recover the correct codeword, such as a retransmission of the data (e.g., re-reading or retransmission of the codeword). Re-transmission of the data corresponds to re-execution of method 300 from the start.

If, in decision 308, one or more elements of the syndrome vector are equal to one (i.e., $\hat{x}H^T \neq 0$), then LDPC decoder 122 has not converged on a valid codeword. Each element of the syndrome vector that has a value of one is considered an unsatisfied check node (USC), and each element of the 288-bit vector that has a value of zero is either (i) a satisfied check node or (ii) a missatisfied check node (MSC) (i.e., a check node that falsely shows as satisfied). If LDPC decoder 122 has not converged on a valid codeword, then controller 102 determines whether or not to perform another sub-iteration of LDPC decoding (decision 314). Decision 314 may be performed by, for example, determining whether or not a full local iteration has been performed (i.e., whether or not, in the first mode, eleven sub-iterations have been performed). If a full local iteration has not been performed, then LDPC decoding is continued for the next sub-iteration of the current local iteration (action 306).

If a full local iteration has been performed, then controller 102 performs decision 316 to determine whether or not to perform another local iteration. Decision 316 may involve performing one or more suitable methods for determining whether or not to perform another local iteration. According to a first method, controller 102 determines whether or not to perform another local iteration by determining whether a trapping set (a,b) has been encountered, where b is the number of unsatisfied check nodes in the trapping set, and a is the number of erroneous bit nodes (EBNs) associated with those unsatisfied check nodes. The majority of trapping sets typically comprise fewer than five unsatisfied check nodes and fewer than ten erroneous bit nodes. Determining whether LDPC decoder 122 has encountered a trapping set may be performed using any suitable method. For example, the decoder could track the number ($b_{observed}$) of unsatisfied check nodes over several iterations. If, over several iterations, the number of unsatisfied check nodes is relatively stable, then this could be indicative of a trapping set. Determining whether the number of unsatisfied check nodes is relatively stable may be performed by tracking the variance of the number of unsatisfied check nodes over several iterations.

As yet another example of this first method, LDPC decoder 122 could determine whether (i) the vector resulting from $\hat{x}H^T$ possesses a number ($b_{observed}$) of unsatisfied check nodes that is greater than zero and less than a specified number ($b_{max}$) of unsatisfied check nodes (e.g., 16) and (ii) the particular configuration of unsatisfied check nodes has remained relatively stable (i.e., the number and locations of the unsatisfied check nodes have not changed) for several local iterations of LDPC decoder 122 (e.g., two or three local iterations). If, over several local iterations, the number and configuration of unsatisfied check nodes are relatively stable, then this could be indicative of a trapping set. As even yet another example of this first method, LDPC decoder 122 could just consider whether the configuration of unsatisfied check nodes has remained relatively stable.

According to a second method of determining whether or not to perform another local iteration, controller 102 may compare the number of local iterations already performed by LDPC decoder 122 to a specified threshold number of local iterations. Note that this method could be used in conjunction with the above-mentioned method for determining whether a trapping set has been encountered. For example, LDPC decoder 122 could continue decoding as long as (i) a trapping set has not been encountered and (ii) LDPC decoder 122 has not performed the specified threshold number of local iterations. If either (i) a trapping set is encountered or (ii) LDPC decoder 122 has performed the specified threshold number of local iterations, then decoding is discontinued. The first method may be advantageous when LDPC decoder 122 converges on a trapping set before the specified threshold number of local iterations has been reached. By identifying a trapping set before the specified threshold number of local iterations has been reached, the decoder can avoid performing unnecessary local iterations. The second method may be advantageous when the number and/or configuration of trapping sets have not stabilized after the specified threshold number of local iterations. This may prevent LDPC decoder 122 from running for extended periods of time, resulting in increased latency of LDPC decoder 122.

If, in decision 316, controller 102 determines that LDPC decoder 122 has (i) not reached the specified local iteration threshold and (ii) not converged on a trapping set, then processing returns to action 306 to perform another local LDPC decoding iteration. If, on the other hand, controller 102 determines that LDPC decoder 122 has either (i) reached the specified local iteration threshold or (ii) converged on a trapping set, then controller 102 determines whether or not to perform an additional global iteration (decision 318). A global iteration is an iteration that includes channel detection, interleaving (if employed by the turbo equalizer), and one or more local iterations of the LDPC decoder.

Decision 318 may be performed by, for example, comparing the number of global iterations performed to a specified global iteration threshold. If the number of global iterations performed is less than the specified global iteration threshold, then turbo equalizer 104 performs an additional global iteration. To perform an additional global iteration, LDPC decoder 122 generates an extrinsic soft-output value $Le_n$ for each bit n of the LDPC-encoded codeword as shown in Equation (1) below:

$$Le_n = P_n - La_n^{(0)}. \quad (1)$$

The extrinsic soft-output values $Le_n$ corresponding to user data, herein referred to as user-data extrinsic soft-output values $Le_n$, are de-interleaved by de-interleaver 118, which uses a de-interleaving mapping $\pi_u^{-1}$ that is the inverse of the interleaving mapping $\pi_u$ used by interleaver 114. Further, the extrinsic soft-output values $Le_n$ corresponding to parity bits, herein referred to as parity extrinsic soft-output values $Le_n$, are de-interleaved by de-interleaver 120, which uses a de-interleaving mapping $\pi_p^{-1}$ that is the inverse of the interleaving mapping $\pi_p$ used by interleaver 116.

The de-interleaved parity and user-data extrinsic soft-output values $Le_n$ are multiplexed using multiplexer 112 and provided to channel detector 108. Channel detector 108 performs another iteration of detection (action 304) on the samples $y_n$ of the equalized, retrieved data stream, which are stored by y memory 106 during the first global iteration. In so doing, channel detector 108 uses the extrinsic soft-output values $Le_n$ to improve detection. For example, in Viterbi detection, the extrinsic soft-output values $Le_n$ are used to improve the branch-metric calculation. Additionally, channel detector 108 uses the extrinsic soft-output values $Le_n$ to calculate new channel soft-output values $La_n$ as shown in Equation (2) as follows:

$$La_n = Pdet_n - Le_n \qquad (2)$$

where $Pdet_n$ is an updated soft-output value generated by channel detector 108 for each bit n of the LDPC-encoded codeword. The newly calculated channel soft-output values $La_n$ are then provided to multiplexer 110 and processed by interleavers 114 and 116 and LDPC decoder 122 as discussed above.

In addition to determining whether or not to perform another global iteration, controller 102 determines whether or not to initiate the second mode (decision 320), in which all twelve layers of H-matrix 200 are processed for each full local iteration performed. This decision may be performed by, for example, determining whether the number ($b_{observed}$) of unsatisfied check nodes exceeds a specified threshold number ($b_{1,max}$) of unsatisfied check nodes (e.g., 32). Note that $b_{1,max}$ may be determined experimentally, and that $b_{1,max}$ may be selected such that, (i) when $b_{observed}$ is greater than $b_{1,max}$, the decoder is operating in the waterfall region and (ii) when $b_{observed}$ is less than $b_{1,max}$ the decoder is operating in the error floor region. The waterfall and error floor regions are areas on a graph of the bit-error rate (BER) of an LDPC decoder as a function of the signal-to-noise ratio (SNR). Specifically, the waterfall region is an area where the BER improves (decreases) rapidly given a unit increase in SNR, and the error floor region is an area where unit increases in SNR yield only modest or no improvements in BER. In one example, the error-floor region may exist where the number a of bit errors is less than 64 and the number b of unsatisfied check nodes is less than 32.

If the number ($b_{observed}$) of unsatisfied check nodes exceeds $b_{1,max}$, then the additional global iteration is performed in the first mode as described above, where only eleven of the twelve layers of H-matrix 200 are processed by LDPC decoder 122. If, on the other hand, the number ($b_{observed}$) of unsatisfied check nodes is less than or equal to $b_{1,max}$, then turbo equalizer 104 initiates the second mode (action 322), in which LDPC decoder 122 performs the check node and variable node updates for all twelve layers of H-matrix 200 for each full local iteration performed, including the updates for the skipped layer.

If, in decision 318, turbo equalizer 104 determines that the number of global iterations performed is not less than or equal to the specified global iteration threshold, then controller 102 may determine (decision 324) whether or not to perform a suitable post-processing method (action 326) to recover a valid LDPC-encoded codeword. Decision 324 may be performed by, for example, determining whether the number ($b_{observed}$) of unsatisfied check nodes from the last iteration exceeds a specified threshold number ($b_{2,max}$) of unsatisfied check nodes (e.g., 16), where $b_{2,max}$ may be determined experimentally. If the number ($b_{observed}$) of unsatisfied check nodes is less than or equal to the specified threshold number ($b_{2,max}$) of unsatisfied check nodes, then it is likely that LDPC decoder 122 has converged on a trapping set (i.e., an observed trapping set) that may be broken.

A number of different post-processing methods (action 326) may be used to break the observed trapping set. These methods may include off-line processing methods or on-line processing methods. For example, in one category of off-line post-processing methods known as list decoding, the observed trapping set is matched against a database of trapping sets known by the decoder. To perform list decoding, the observed trapping set is compared to the known trapping sets in the database until either (i) a match is found or (ii) it is determined that none of the known trapping sets match the observed trapping set. If a known trapping set is found in the database that matches the observed trapping set, then erroneous bit node index value(s) corresponding to the known trapping set are retrieved from the trapping-set database. Then, the channel soft-output values $La_n$ corresponding to the erroneous bit node index value(s) are adjusted, and the decoder is restarted using the adjusted channel soft-output values $La_n$. Often, adjusting one or two channel soft-output values $La_n$ is sufficient to break the trapping set, and the re-started decoder will converge on the correct codeword. More-detailed discussions of list-decoding methods are provided in PCT patent application no. PCT/US08/86523, PCT patent application no. PCT/US08/86537, and U.S. patent application Ser. No. 12/540,002.

As another example, in one category of on-line processing methods, the check node updating algorithm employed by LDPC decoder 122 may be changed, for example, to perform scaling and/or offsetting. A more detailed discussion of an on-line processing method that changes the check-node updating algorithm may be found in U.S. patent application Ser. No. 12/680,810. Controller 102 may perform any suitable post-processing technique other than, or in addition to, the examples given above.

Note that the order in which post-processing methods and global iterations are performed may vary from one embodiment to the next. For example, turbo equalizer 104 could perform global iterations up to the specified global iteration threshold before performing one or more post-processing methods to converge on a valid codeword. In this case, controller 102 may need to do some relatively lengthy processing (i.e., off-the-fly processing). As another example, turbo equalizer 104 could perform one or more post-processing methods before or in conjunction with performing further global iterations (i.e., on-the-fly).

If, in decision 324, controller 102 determines that the number ($b_{observed}$) of unsatisfied check nodes exceeds the specified threshold number ($b_{2,max}$) of unsatisfied check nodes, then it is likely that LDPC decoder 122 has experienced an error in the communication channel, such as a scratch on the surface of a hard disk. In such a case, it is not likely that a post-processing method or another global iteration would be suitable for recovering a valid codeword. Thus, controller 102 may decide to retransmit the data (decision 328) and return to action 302. Alternatively, if turbo equalizer 104 is not able to recover a valid codeword, the controller 102 may stop processing for the subject codeword altogether.

Although the present invention was described relative to the specific H-matrix 200 of FIG. 2, the present invention is not so limited. The present invention may be implemented for various parity-check matrices that are suitable for message-passing decoding and that are the same size as or a different size from H-matrix 200 of FIG. 2. For example, the present invention may be implemented for H-matrices in which the number of columns, block columns, rows, block rows, layers, messages processed per clock cycle, the size of the sub-matrices, the size of the layers, and/or the column and/or row hamming weights differ from that of H-matrix 200.

As another example, the present invention may be implemented for H-matrices in which the skipped layer is a layer other than the last layer as shown in FIG. 2. As yet another example, the present invention may be implemented for H-matrices having more than one skipped layer. As even yet another example, the present invention may be implemented for H-matrices in which the one or more skipped layers have sub-matrices other than, or in addition to, identity matrices.

Such other sub-matrices may be, for example, permuted identity matrices (such as circulants) or zero matrices. Such other sub-matrices may also be formed by a collection of identity or permuted identity matrices. For instance, in FIG. 2, each matrix entry of the skipped layer could be comprised of 16 identity matrixes, where (i) each identity matrix is a 24×24 identity matrix and (ii) the 16 identity matrixes are arranged in four rows and four columns (to form a 96×96 sub-matrix). In general, it is preferable (but not necessary) that the individual rows of the one or more skipped layers have hamming weights that are greater than the hamming weights of the individual rows of the other (non-skipped) layers. As even yet still another example, the one or more skipped layers could have a different number of rows than the other, non-skipped, layers. For instance, in FIG. 2, the last layer could have 24 rows. Each element in the last layer could be a 24×96 sub-matrix comprised of four 24×24 circulants.

By skipping the updating of one or more layers in the first mode, decoders of the present invention may increase throughput over the throughput of the decoder when it is operating in the second mode. Simulations have shown that, when operating in the first mode, performance in the waterfall region may be approximately the same as when operating in the second mode. Further, when operating in the second mode (i.e., by performing the updating of all of the layers, including the one or more previously skipped layers), the likelihood of recovering a valid codeword is increased in the error floor region.

According to various embodiments of the present invention, the first and second modes may process two different sets of layers. Two sets of layers are different as long as at least one layer in one set is not in the other set. For example, in H-matrix 200 of FIG. 2, the first set of layers, which has the first through eleventh block rows, is different from the second set of layers, which has the first through twelfth block rows. In this example, the first set of layers is a subset of the second set of layers because all eleven layers in the first set of layers are in the second set of layers. According to other embodiments, the first set of layers may contain layers that are not in the second set, and vice versa. For example, in H-matrix 200 of FIG. 2, the first set of layers could have all layers except for the twelfth layer, and the second set of layers could have all layers except for the eleventh layer. Thus, the first set of layers has the eleventh layer, which is not included in the second set of layers, and the second set of layers has the twelfth layer, which is not included in the first set of layers.

Various embodiments of the present invention may be envisioned that may be selectively operated in more than two modes. For example, according to one embodiment, an LDPC decoder may be selectively operated in three modes, wherein (i) in the first mode, the updates of two layers of the corresponding H-matrix are skipped for each full local decoder iteration, (ii) in the second mode, the updates of one layer of the corresponding H-matrix is skipped for each full local decoder iteration, and (iii) in the third mode, the updates all of the layers of the corresponding H-matrix are performed for each full local decoder iteration. Other embodiments of the present invention may have more than 3 modes. In yet other embodiments, the number of layers skipped in each mode may differ from the examples provided herein. In even yet other embodiments, the particular layers skipped may differ from the examples provided herein.

Although embodiments of the present invention have been described in the context of LDPC codes, the present invention is not so limited. Embodiments of the present invention could be implemented for other error-correction (EC) codes that can be defined by a graph, e.g., tornado codes, structured IRA codes, since it is graph-defined codes that suffer from trapping sets.

Although the present invention has been described relative to the specific turbo equalizer configuration of FIG. 1, the present invention is not so limited. Various embodiments of the present invention may also be envisioned for other turbo equalizer structures. For example, the processing of FIG. 3 may be implemented for turbo equalizers that employ (i) more than one LDPC decoder and/or (ii) more than one channel detector and/or (iii) different interleaving schemes from that shown in FIG. 1, including no interleaving scheme.

While the present invention was described as initiating the second mode at the start of a global iteration, the present invention is not so limited. The second mode may also be initiated during the performance of a global iteration, such as between consecutive sub-iterations or between consecutive local iterations of the LDPC decoder.

Further, a decision to initiate the second mode may be performed in a manner other than that described above in relation to decision 320 of FIG. 3. For example, decision 320 could determine whether or not to initiate the second mode if both of the following conditions are met: (i) the number of USCs is less than the threshold and (ii) the number of USCs corresponding to the skipped layer is greater than zero.

It will be further understood that various changes in the details, materials, and arrangements of the parts which have been described and illustrated in order to explain the nature of this invention may be made by those skilled in the art without departing from the scope of the invention as expressed in the following claims.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

The present invention can also be embodied in the form of a bitstream or other sequence of signal values stored in a non-transitory recording medium generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A receiver-implemented method for recovering an error correction-encoded codeword that is encoded based on a parity-check matrix having a plurality of layers, the method comprising:
   (a) performing one or more full local iterations of layered error correction decoding on a first set of input values in a first mode, wherein, for each full local iteration of error correction decoding performed in the first mode, updates corresponding to a first set of layers of the parity-check matrix are performed; and
   (b) performing one or more full local iterations of layered error correction decoding on a second set of input values in a second mode, wherein, for each full local iteration of error correction decoding in the second mode, updates corresponding to a second set of the layers of the parity-check matrix are performed, wherein the second set of layers is different from the first set of layers.

2. The receiver-implemented method of claim 1, wherein:
   the first set of layers includes one or more layers of the parity check matrix and excludes one or more other layers of the parity-check matrix; and
   the second set of layers includes all layers of the parity-check matrix.

3. The receiver-implemented method of claim 2, wherein at least one row in the one or more layers of the parity-check matrix that are excluded from the first set of layers has a check-node degree that is greater than check-node degrees of all rows in the one or more layers of the parity-check matrix that are included in the first set of layers.

4. The receiver-implemented method of claim 1, wherein:
   step (a) comprises performing initial channel detection on a set of received samples to generate the first set of input values in the first mode; and
   step (b) comprises performing subsequent channel detection on the set of received samples to generate the second set of input values in the second mode.

5. The receiver-implemented method of claim 4, wherein the subsequent channel detection is based on extrinsic data generated by performing the layered error correction decoding in the first mode.

6. The receiver-implemented method of claim 1, wherein step (a) further comprises:
   comparing a number of unsatisfied check nodes corresponding to the layered error correction decoding in the first mode to a specified threshold value; and
   generating a decision to perform step (b) based on the comparison.

7. The receiver-implemented method of claim 6, wherein the decision to perform step (b) is generated if the number of unsatisfied check nodes is less than the specified threshold value.

8. The receiver-implemented method of claim 1, wherein the error correction-encoded codeword is a low-density parity-check-encoded codeword and the error correction decoding is low-density parity-check decoding.

9. The receiver-implemented method of claim 1, wherein the first set of input values is different from the second set of input values.

10. The receiver-implemented method of claim 1, wherein, in the first mode, at least one layer of the parity-check matrix is included in the layered error correction decoding and at least one other layer of the parity-check matrix is excluded from the layered error correction decoding.

11. The receiver-implemented method of claim 1, wherein the first and second sets of layers share at least one layer of the parity-check matrix.

12. An apparatus that recovers an error correction-encoded codeword that is encoded based on a parity-check matrix having a plurality of layers, the apparatus comprising:
   an error correction decoder configured to:
      perform one or more full local iterations of layered error correction decoding on a first set of input values in a first mode, wherein, for each full local iteration of error correction decoding performed in the first mode, updates corresponding to a first set of layers of the parity-check matrix are performed; and
      perform one or more full local iterations of layered error correction decoding on a second set of input values in a second mode, wherein, for each full local iteration of error correction decoding in the second mode, updates corresponding to a second set of layers of the parity-check matrix are performed, wherein the second set of layers is different from the first set of layers; and
   a controller configured to control whether the error correction decoder operates in the first mode or the second mode.

13. The apparatus of claim 12, wherein:
   the first set of layers includes one or more layers of the parity check matrix and excludes one or more one or more other layers of the parity-check matrix; and
   the second set of layers includes all layers of the parity-check matrix.

14. The apparatus of claim 13, wherein at least one row in the one or more layers of the parity-check matrix that are excluded from the first set of layers has a check-node degree that is greater than check-node degrees of all rows in the one or more layers of the parity-check matrix that are included in the first set of layers.

15. The apparatus of claim 12, further comprising a channel detector configured to:
perform initial channel detection on a set of received samples to generate the first set of input values in the first mode; and
perform subsequent channel detection on the set of received samples to generate the second set of input values in the second mode.

16. The apparatus of claim 15, wherein the subsequent channel detection is based on extrinsic data generated by the error correction decoder in the first mode.

17. The apparatus of claim 12, wherein:
the controller compares a number of unsatisfied check nodes corresponding to the layered error correction decoding in the first mode to a specified threshold value; and
the controller generates a decision to perform layered error correction decoding in the second mode based on the comparison.

18. The apparatus of claim 17, wherein the decision to perform layered error correction decoding in the second mode is generated if the number of unsatisfied check nodes is less than the specified threshold value.

19. The apparatus of claim 12, wherein the error correction-encoded codeword is a low-density parity-check-encoded codeword and the error correction decoder is an low-density parity-check decoder.

20. The apparatus of claim 12, wherein the first set of input values is different from the second set of input values.

21. The apparatus of claim 12, wherein, in the first mode, at least one layer of the parity-check matrix is included in the layered error correction decoding and at least one other layer of the parity-check matrix is excluded from the layered error correction decoding.

22. The apparatus of claim 12, wherein the first and second sets of layers share at least one layer of the parity-check matrix.

23. An apparatus that recovers an error correction-encoded codeword that is encoded based on a parity-check matrix having a plurality of layers, the apparatus comprising:
means for performing one or more full local iterations of layered error correction decoding on a first set of input values in a first mode, wherein, for each full local iteration of error correction decoding performed in the first mode, updates corresponding to a first set of layers of the parity-check matrix are performed; and
means for performing one or more full local iterations of layered error correction decoding on a second set of input values in a second mode, wherein, for each full local iteration of error correction decoding in the second mode, updates corresponding to a second set of layers of the parity-check matrix are performed, wherein the second set of layers is different from the first set of layers; and
means for controlling whether the error correction decoder operates in the first mode or the second mode.

* * * * *